US011335768B2

(12) United States Patent
Ainsworth

(10) Patent No.: US 11,335,768 B2
(45) Date of Patent: May 17, 2022

(54) INTEGRATED HIGH VOLTAGE CAPACITOR

(71) Applicant: Semtech Corporation, Camarillo, CA (US)

(72) Inventor: Christopher David Ainsworth, South Wales (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/377,070

(22) Filed: Apr. 5, 2019

(65) Prior Publication Data
US 2019/0319086 A1 Oct. 17, 2019

Related U.S. Application Data

(60) Provisional application No. 62/658,073, filed on Apr. 16, 2018.

(51) Int. Cl.
H01L 49/02 (2006.01)
H01L 23/58 (2006.01)
(Continued)

(52) U.S. Cl.
CPC .......... H01L 28/60 (2013.01); H01L 23/585 (2013.01); H01L 23/647 (2013.01); H01L 24/32 (2013.01);
(Continued)

(58) Field of Classification Search
CPC ..... H01L 23/585; H01L 23/642; H01L 28/40; H01L 28/60; H01L 28/86; H01L 28/87; H01L 28/88
(Continued)

(56) References Cited

U.S. PATENT DOCUMENTS 5,023,951 A * 6/1991 Kahn ................ H04B 10/69
398/202
6,774,448 B1 * 8/2004 Lindemann ......... H01L 27/1463
257/466
(Continued)

FOREIGN PATENT DOCUMENTS

GB 2365217 A 2/2002

OTHER PUBLICATIONS

Reeb Winfried, "Progress Through Photonics Pulsed Laser Diodes and Avalanche Photodiodes for Industrial and Commercial Applications", Physics' Best, Jul. 1, 2006 (Jul. 1, 2006), pp. 1-, Retrieved from the Internet URL: https://web.archive.org/web/20110713184653if_/ http://www.lasercomponents.com/de/fileadmin/user_upload/home/ datasheets/lc/veroeffentlichung/progress-through-photonics.pdf.

Primary Examiner — Matthew E Warren
(74) Attorney, Agent, or Firm — Brian M. Kaufman; Robert D. Atkins; Patent Law Group: Atkins and Associates, P.C.

(57) ABSTRACT

A semiconductor device comprises a semiconductor die and an integrated capacitor formed over the semiconductor die. The integrated capacitor is configured to receive a high voltage signal. A transimpedance amplifier is formed in the semiconductor die. An avalanche photodiode is disposed over or adjacent to the semiconductor die. The integrated capacitor is coupled between the avalanche photodiode and a ground node. A resistor is coupled between a high voltage input and the avalanche photodiode. The resistor is an integrated passive device (IPD) formed over the semiconductor die. A first terminal of the integrated capacitor is coupled to a ground voltage node. A second terminal of the integrated capacitor is coupled to a voltage greater than 20 volts. The integrated capacitor comprises a plurality of interdigitated fingers in one embodiment. In another
(Continued)

embodiment, the integrated capacitor comprises a plurality of vertically aligned plates.

17 Claims, 15 Drawing Sheets

(51) Int. Cl.
*H01L 23/64* (2006.01)
*H01L 23/00* (2006.01)
*H01L 25/16* (2006.01)
*H01L 31/02* (2006.01)
*H01L 31/107* (2006.01)
*H03F 3/08* (2006.01)

(52) U.S. Cl.
CPC .............. *H01L 24/48* (2013.01); *H01L 24/85* (2013.01); *H01L 25/167* (2013.01); *H01L 28/20* (2013.01); *H01L 31/02005* (2013.01); *H01L 31/02019* (2013.01); *H01L 31/107* (2013.01); *H03F 3/08* (2013.01); *H01L 24/05* (2013.01); *H01L 24/73* (2013.01); *H01L 2224/0231* (2013.01); *H01L 2224/02331* (2013.01); *H01L 2224/04042* (2013.01); *H01L 2224/05569* (2013.01); *H01L 2224/32145* (2013.01); *H01L 2224/48091* (2013.01); *H01L 2224/48106* (2013.01); *H01L 2224/48137* (2013.01); *H01L 2224/48145* (2013.01); *H01L 2224/48229* (2013.01); *H01L 2224/73265* (2013.01); *H01L 2924/12043* (2013.01); *H01L 2924/19011* (2013.01); *H01L 2924/19041* (2013.01); *H01L 2924/19043* (2013.01); *H03F 2200/165* (2013.01)

(58) Field of Classification Search
USPC .................................................. 257/532–536
See application file for complete search history.

(56) References Cited

U.S. PATENT DOCUMENTS

| | | | |
|---|---|---|---|
| 2005/0185882 A1 | 8/2005 | Zack et al. | |
| 2006/0034621 A1 | 2/2006 | Denoyer | |
| 2006/0049338 A1* | 3/2006 | Sherazi | H04B 10/0799 |
| | | | 250/214 R |
| 2008/0054331 A1* | 3/2008 | Chen | H01L 29/42324 |
| | | | 257/315 |
| 2011/0215225 A1* | 9/2011 | Takechi | H03F 3/08 |
| | | | 250/208.2 |
| 2012/0162947 A1* | 6/2012 | O'Donnell | H01L 28/60 |
| | | | 361/783 |
| 2013/0093047 A1 | 4/2013 | Huang et al. | |
| 2014/0253227 A1* | 9/2014 | Yach | H01L 23/49575 |
| | | | 327/540 |
| 2015/0063832 A1* | 3/2015 | Park | G02B 6/4274 |
| | | | 398/214 |
| 2016/0336368 A1* | 11/2016 | Lee | H04B 10/25891 |
| 2017/0053930 A1* | 2/2017 | Prinz | H01L 29/42344 |
| 2018/0316441 A1* | 11/2018 | Yagisawa | H04B 10/40 |
| 2020/0127029 A1* | 4/2020 | Meynants | H01L 27/1464 |

* cited by examiner

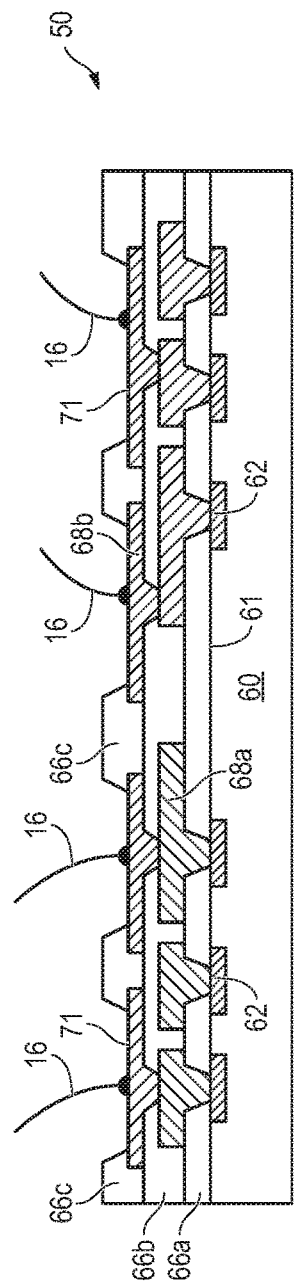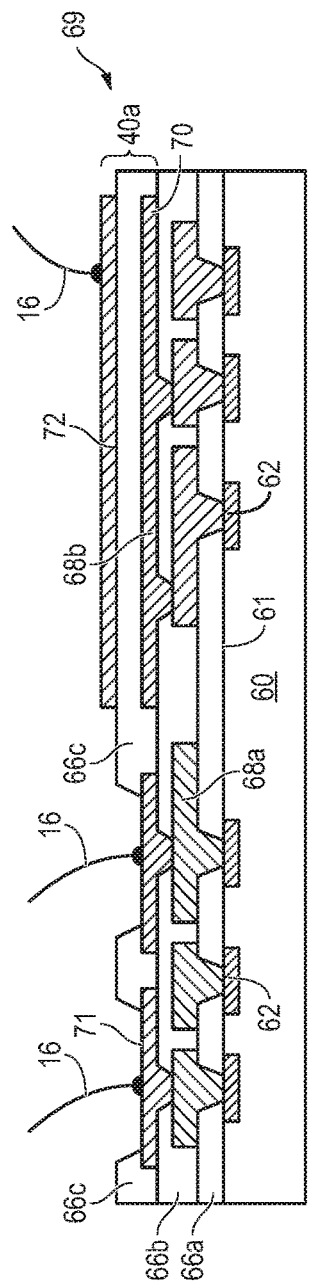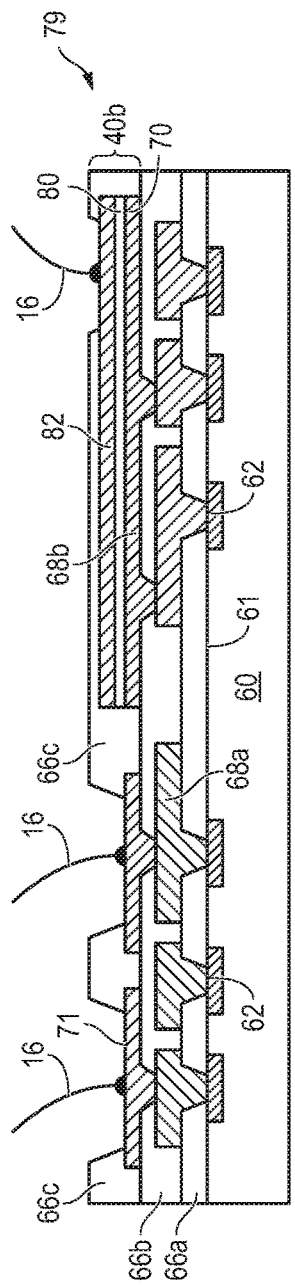

INTEGRATED HIGH VOLTAGE CAPACITOR

CLAIM TO DOMESTIC PRIORITY

The present application claims the benefit of U.S. Provisional Application No. 62/658,073, filed Apr. 16, 2018, which application is incorporated herein by reference.

FIELD OF THE INVENTION

The present invention relates in general to semiconductor devices and, more particularly, to a semiconductor device and method of filtering interference using an integrated high voltage capacitor.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), photodiode, small signal transistor, resistor, capacitor, inductor, or power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Optical fibers are commonly used to transmit signals between semiconductor devices that are remote from each other. A light emitting diode (LED), laser diode, or another electronically controllable light source is used to generate a light wave into a fiber. The fiber guides the light wave from the source device to a destination device. The destination device includes a photodiode that converts the optical signal into an electrical signal. Commonly an avalanche photodiode (APD) is used. A transimpedance amplifier (TIA) is used in a circuit with the APD to condition the electrical signal for use by semiconductor devices.

FIG. 1 illustrates an example of an APD can 10. APD can 10 is a receiver optical sub-assembly (ROSA) package with an APD 20, TIA 30, and other supporting semiconductor devices integrated in a can-shaped package. A top surface 12 of can 10 includes an opening 13 to expose at least APD 20 within the can to receive an incoming optical signal. In some embodiments, a lens is disposed in opening 13 to focus light waves on APD 20. Legs 14 extend down from the can for mounting of can 10 onto a circuit board or other substrate. Legs 14 extend through the bottom of APD can 10 and are connected to the semiconductor devices within the APD can by bond wires 16. APD can 10 receives an optical signal through opening 13 and transmits an electrical signal through legs 14 to be processed by connected semiconductor devices.

APD 20 uses a high voltage power source, typically between 20 and 90 volts, e.g., 40 volts. The high voltage power signal may include interference from electromagnetic signals. With the recent proliferation of Wi-Fi operating on the 5 GHz channel, there is a particular need to filter out electromagnetic interference (EMI) around 5 GHz in ROSA packages.

FIG. 2 illustrates one exemplary circuit diagram of an APD 20 and TIA 30 used to receive a fiber optic signal. A current source 24 and APD 20 are coupled in series between high voltage source 26 and ground node 28. A light wave hitting APD 20 modifies the resistance of electrical current through the APD, thus changing the voltage input to TIA 30 at circuit node 29. TIA 30 is coupled between circuit node 29 and output node 38. TIA 30 includes a feedback circuit comprised of MOSFET 32 and resistor 34. MOSFET 32 and resistor 34 are coupled in series between a $V_{DD}$ or low voltage rail 36 and the input of TIA 30 at circuit node 29.

Noise on the high voltage source 26 will affect the signal output by TIA 30 at output node 38. One solution is to add a resistor 42 coupled in series between high voltage source 26 and APD 20 and a high voltage capacitor 40 coupled from the cathode of APD 20 to ground node 28. High voltage capacitor 40 includes a capacitance value suitable to shunt interference in the 5 GHz range to ground, e.g., 200 pf. Resistor 42 is a suitable resistance value to form a single pole low pass filter with capacitor 40, e.g., 500 ohms.

In the present state of the art, high voltage capacitor 40 and resistor 42 have been implemented using one or more discrete components disposed in can 10 along with APD 20 and TIA 30. FIG. 3 illustrates an example of a semiconductor package 44 including capacitor 40 and resistor 42 provided within can 10 to filter power from high voltage input 26 to photodiode 20. Photodiode 20 is stacked on a TIA semiconductor package 50. APD can 10 has five legs 14 extending through the bottom of the can: high voltage input 26, low voltage input 36, ground 28, and a balanced output 38a and 38b. All of the legs 14 other than ground node 28 are electrically isolated from the can package 10 by insulating rings 56. The can package body is connected to ground node 28.

The extra semiconductor package 44 needed to filter 5 GHz interference adds cost to the final package, as well as adding to the inductance of interconnects between the multiple components by having additional bond wires 16. In addition, the overall footprint of the circuit is increased by having to place an extra part in can 10. The footprint can be reduced by stacking discrete component package 44 between TIA 30 and APD 20, but that configuration puts strain on other design parameters. The increased stack height introduces new challenges in focusing light through opening 13 on APD 20, potentially reducing sensitivity.

One issue limiting the options for electrical components used to form the filter is that the high voltage power supply is not suitable for processing on an integrated circuit. The maximum voltage applied to TIA parts is normally around 3.6 volts. Therefore, separate discrete components have always been required to filter out 5 GHz interference on the high voltage input. A need exists for an improved method to filter interference from 5 GHZ signals for ROSA packages.

BRIEF DESCRIPTION OF THE DRAWINGS

FIGS. 4a-4c illustrate a metal-insulator-metal capacitor formed in conductive layers over the transimpedance amplifier semiconductor die;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
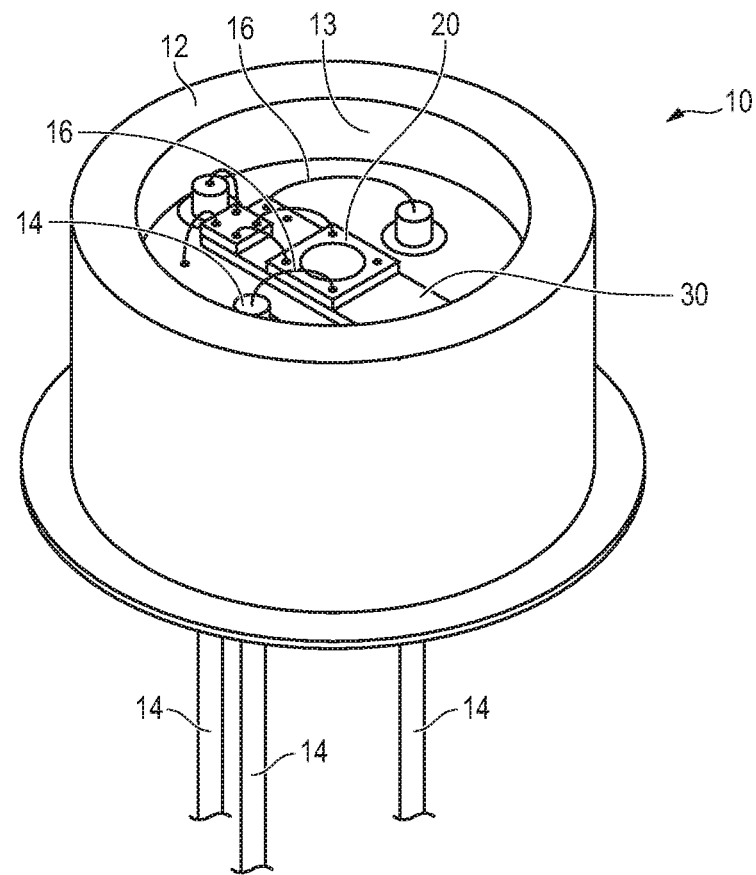
FIG. 1 illustrates a receiver optical sub-assembly in a can package.
Figure 2:
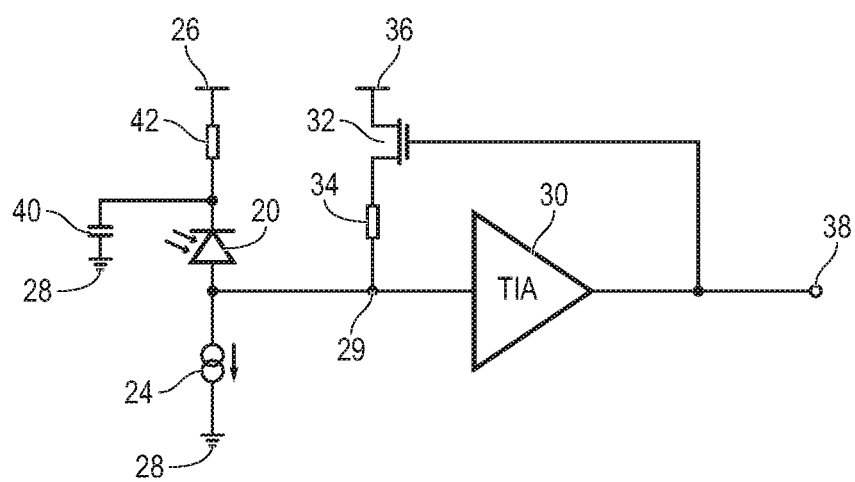
FIG. 2 illustrates a photodetector circuit diagram with an avalanche photodiode, transimpedance amplifier, and 5 GHz RC filter.
Figure 3:
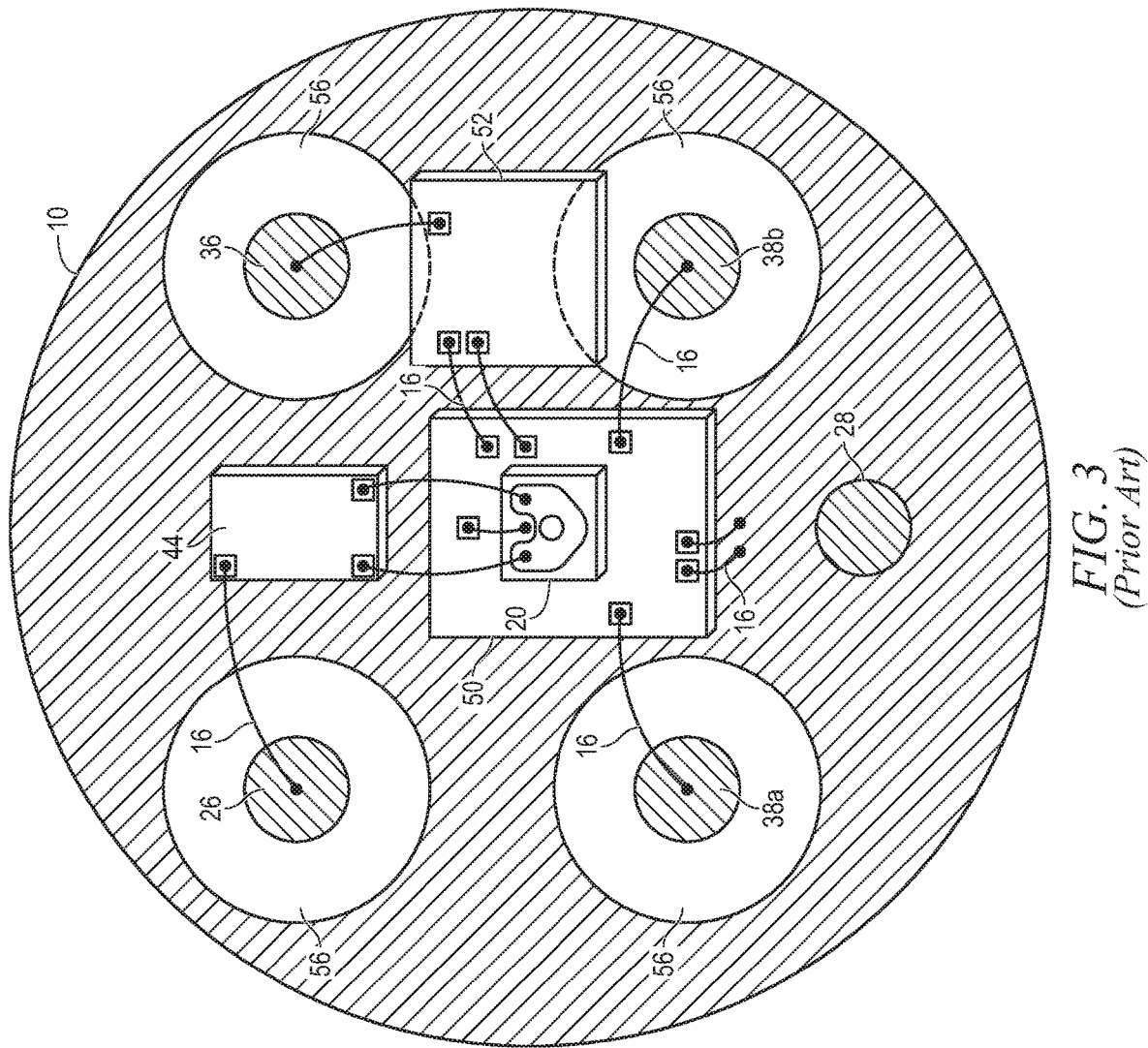
FIG. 3 illustrates an implementation of the photodetector circuit in a can package where the filter is formed with a discrete component.

FIG. 4a illustrates a cross-sectional view of TIA package 50 from FIG. 3. TIA package 50 includes a semiconductor die 60 having TIA 30 formed in active surface 61. A plurality of contact pads 62 are formed on active surface 61 to provide ohmic contact to TIA 30. A plurality of oxide or insulating layers 66 and conductive layers or redistribution layers (RDL) 68 are vertically interleaved over semiconductor die 60 to route electrical signals as necessary, in what may be referred to as a build-up interconnect structure. The top conductive layer 68, conductive layer 68b in FIG. 4a, includes a plurality of contact pads 71 for connection of bond wires 16.

While only two conductive layers 68a and 68b are illustrated, any suitable number of routing layers can be formed over semiconductor die 60, with the top conductive layer 68 including contact pads 71 for connection by bond wires 16, solder bumps, stud bumps, or another interconnect structure. The top insulating layer, insulating layer 66c in FIG. 4a, is formed over the contact pads of conductive layer 68b as a solder resist or passivation layer. In some embodiments, insulating layer 66c comprises a plurality of passivation layers formed over conductive layer 68b. Openings are formed in insulating layer 66c for electrical interconnect of bond wires 16 to contact pads 71.

FIG. 4b illustrates TIA package 69 with high voltage capacitor 40 implemented as a metal-insulation-metal (MIM) high voltage capacitor 40a. MIM capacitor 40a is formed as part of conductive layers 68 over APD die 60. Any desired number of conductive layers are formed over semiconductor die 60 to route the electrical signals. As part of the top conductive layer, conductive layer 68b in FIG. 4b, a bottom capacitor plate 70 is formed. Bottom capacitor plate 70 is a plane of conductive material deposited as part of conductive layer 68b that has a suitable shape for a capacitor plate. Bottom capacitor plate 70 is coupled to a ground voltage node through conductive layers 68 and bond wires 16.

Insulating layer 66c is formed over conductive layer 68b as in FIG. 4a. Openings are formed in insulating layer 66c over contact pads 71 for the connection of bond wires 16. However, insulating layer 66c is left to fully cover bottom capacitor plate 70. A top capacitor plate 72 is formed on insulating layer 66c over bottom capacitor plate 70. Top capacitor plate 72 can be formed by the same process and of the same material as conductive layers 68, or other suitable materials and processes can be used. A bond wire 16 is bonded onto top plate 72 to couple capacitor 40a to high voltage source 26 via an optional resistor 42. In one embodiment, a bond wire 16 is formed on bottom plate 70 in an opening of insulating layer 66c outside a footprint of top plate 72. In some embodiments, insulating layer 66c is the first of a plurality of passivation layers formed over conductive layer 68b, and additional passivation layers are formed over top plate 72.

Capacitor plates 70 and 72 form capacitor 40a as a MIM capacitor integrated over TIA die 60. Plate 70 is coupled to ground, while plate 72 is coupled to a high voltage source. In one embodiment, conductive layers 68, including bottom plate 70, are formed from copper, and top plate 72 is formed from aluminum. In another embodiment, the top conductive layer 68, including bottom plate 70, is also formed from aluminum while all underlying conductive layers 68 are copper. In addition to operating as the plate of a capacitor, bottom plate 70 is connected to ground and helps shield the areas of semiconductor die 60 under plate 70 from EMI. Bottom plate 70 coupled to ground also reduces interference caused by the high voltage on top plate 72 being in close proximity to semiconductor die 60.

Insulating layer 66c, which can be the top insulating layer of the build-up interconnect structure stack or a first of one or more passivation layers, operates as the capacitor's dielectric, and can be any suitable oxide or nitride. In designing MIM capacitor 40a, calculations are made to determine that insulating layer 66c between plates 70 and 72 will have a breakdown voltage sufficient for the maximum expected voltage potential of high voltage source 26.

FIG. 4c illustrates an alternative method of forming high voltage capacitor 40 as MIM capacitor 40b in TIA package 79. A bottom capacitor plate 70 is formed as part of conductive layer 68b in much the same manner as above. A dielectric layer 80 is formed on bottom capacitor plate 70 from any suitable capacitor dielectric material, e.g., an oxide or nitride material. Dielectric layer 80 is confined to the area of bottom capacitor plate 70, rather than being formed over the entire device as illustrated with insulating layer 66c in FIG. 4b. Having dielectric layer 80 formed specifically as a capacitor dielectric allows better customization of the material and thickness of the dielectric layer. Dielectric layer 80 can be formed from materials and at thicknesses that may not be suitable for passivation layer 66c.

A top capacitor plate 82 is formed over bottom plate 70 and dielectric layer 80. Top capacitor plate 82 is similar to top plate 72 in FIG. 4b. Insulating layer 66c is formed over conductive layer 68b, dielectric layer 80, and top capacitor plate 82 as a protective covering. Insulating layer 66c covers the edges of top plate 82, which helps protect the MIM capacitor from physical damage and reduces the likelihood that the MIM capacitor layers will peel. Openings are formed in insulating layer 66c over top capacitor plate 82 and contact pads 71 for connection by bond wires 16.

Figure 5A:
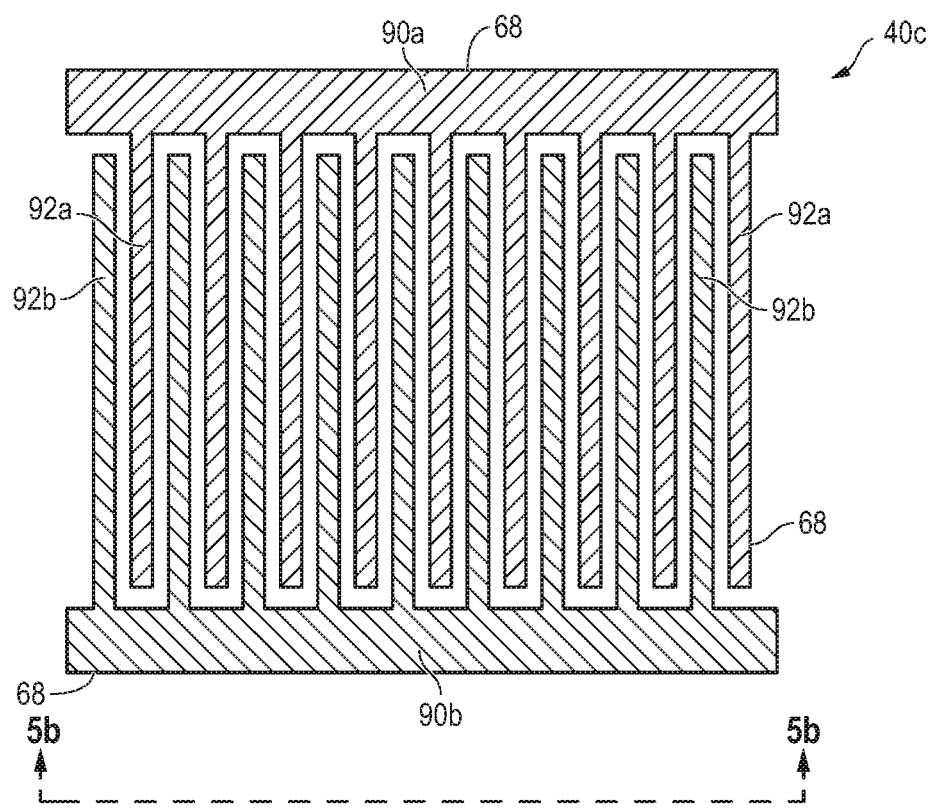
FIGS. 5a-5f illustrate metal-oxide-metal capacitor options.

FIGS. 5a-5f illustrate various embodiments of high voltage capacitor 40 formed as a metal-oxide-metal (MOM) capacitor. FIG. 5a shows MOM capacitor 40c formed within conductive layers 68 over TIA die 60 as with the MIM capacitor embodiments in FIGS. 4b and 4c. However, rather than being formed as two vertically aligned plates, MOM capacitor 40c is formed from a plurality of interdigitated fingers. FIG. 5a illustrates a top-down or plan view of a single conductive layer 68 formed into a portion of MOM capacitor 40c. A pair of bus bars 90a and 90b is formed in parallel. Bus bar 90a has a plurality of fingers 92a extending toward bus bar 90b. Bus bar 90b has a plurality of fingers 92b extending toward bus bar 90a. Each finger 92a is formed between a pair of fingers 92b, and vice versa, without physically contacting each other, to increase capacitance between the two sides.

Bus bar 90a and fingers 92a form one plate of the high voltage MOM capacitor 40c, while bus bar 90b and fingers 92b form the second plate. One bus bar 90a or 90b is coupled to ground, while the second bus bar is coupled to the high voltage input. Insulating layers 66 are formed under, over, and between bus bars 90 and fingers 92 as the capacitor's dielectric. Openings can be formed in insulating layer 66 over bus bars 90a and 90b for connection of subsequent conductive layers 68 or for bond wires 16 from capacitor 40c to ground and the high voltage source. The bus bar 90 coupled to ground can also be coupled to TIA die 60 through conductive layers 68.

Figure 5B:
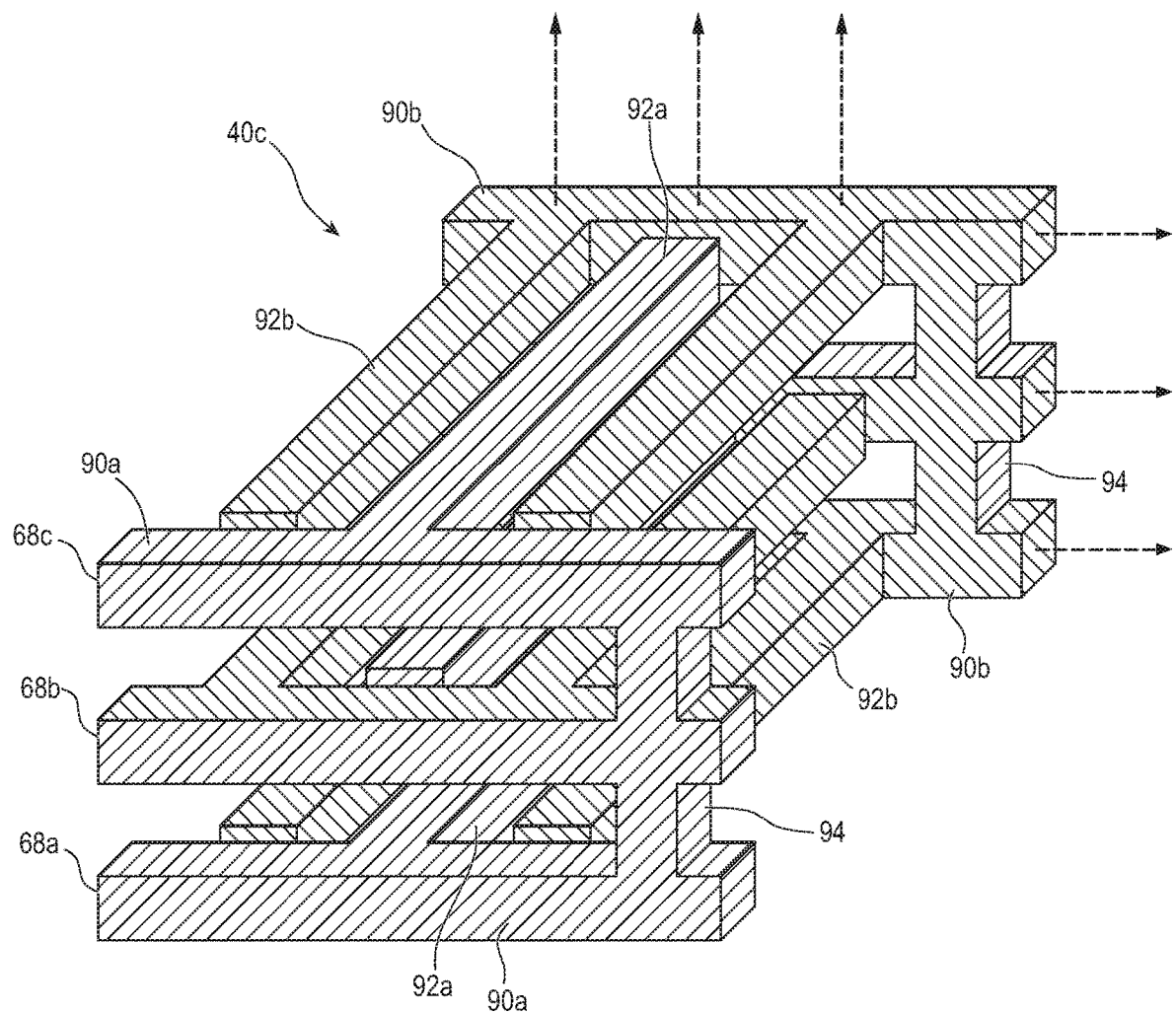

FIG. 5b illustrates a perspective view of multiple conductive layers 68 stacked to increase the capacitance of MOM capacitor 40c. Each individual conductive layer 68 includes fingers 92a and 92b interdigitated as illustrated in FIG. 5a. Each successive conductive layer 68a through 68c includes fingers 92a aligned over the underlying conductive layer's fingers 92b, and fingers 92b over the underlying conductive layer's fingers 92a. Each conductive layer 68 includes a bus bar 90a connected to fingers 92a, and a bus bar 90b connected to fingers 92b. The bus bars 90 of subsequent conductive layers are coupled to each other vertically by conductive vias 94 or other interconnect structures formed through insulating layers 66.

In FIG. 5b, only three conductive layers 68 are illustrated, and each conductive layer only includes three fingers 92. In practice, any desired number of conductive layers 68 can be stacked with vertically alternating fingers 92a and 92b, and with any desired number of fingers per conductive layer to achieve a desired capacitance value. All of the fingers 92a of each conductive layer 68 are electrically coupled to each other as one side of MOM capacitor 40c, and all of the fingers 92b of each conductive layer 68 are electrically coupled to each other as the other side of the MOM capacitor 40c.

The fingers 92 are interdigitated vertically and horizontally so that each high voltage finger 92 is directly adjacent to as many as four fingers at ground potential, and vice versa. In one embodiment, MOM capacitor 40c is built up over nine conductive layers using 0.1 micrometer (μm) finger spacing. In other embodiments, a MOM capacitor is formed by stacking fingers over each other perpendicularly instead of parallel as illustrated in FIG. 5b. MOM capacitor 40c is normally formed beginning from the first metal layer over semiconductor die 60. In other embodiments, a ground plane is formed in the first conductive layer 68a between MOM capacitor 40c and the underlying portion of semiconductor die 60, and MOM capacitor 40c is manufactured starting with the second conductive layer 68b. Lower conductive layers are normally preferred because the fabrication process includes smaller conductive traces at lower conductive layers, which satisfies the desired sizing of a MOM capacitor. However, a MOM capacitor can be formed in any combination of conductive layers.

In FIG. 5b, fingers 92a are vertically stacked directly over or under fingers 92b, so that each finger 92 is above or below a finger of opposite polarity. The vertical interleaving of fingers 92 increases the capacitance per volume of the MOM capacitor but creates some problems for higher voltage potentials. MOM capacitor 40c is suitable for up to around 35-40 volts, but leakage between the vertically interleaved stacked fingers 92 above 35 volts reduces the performance of capacitor 40c.

Figure 5C:
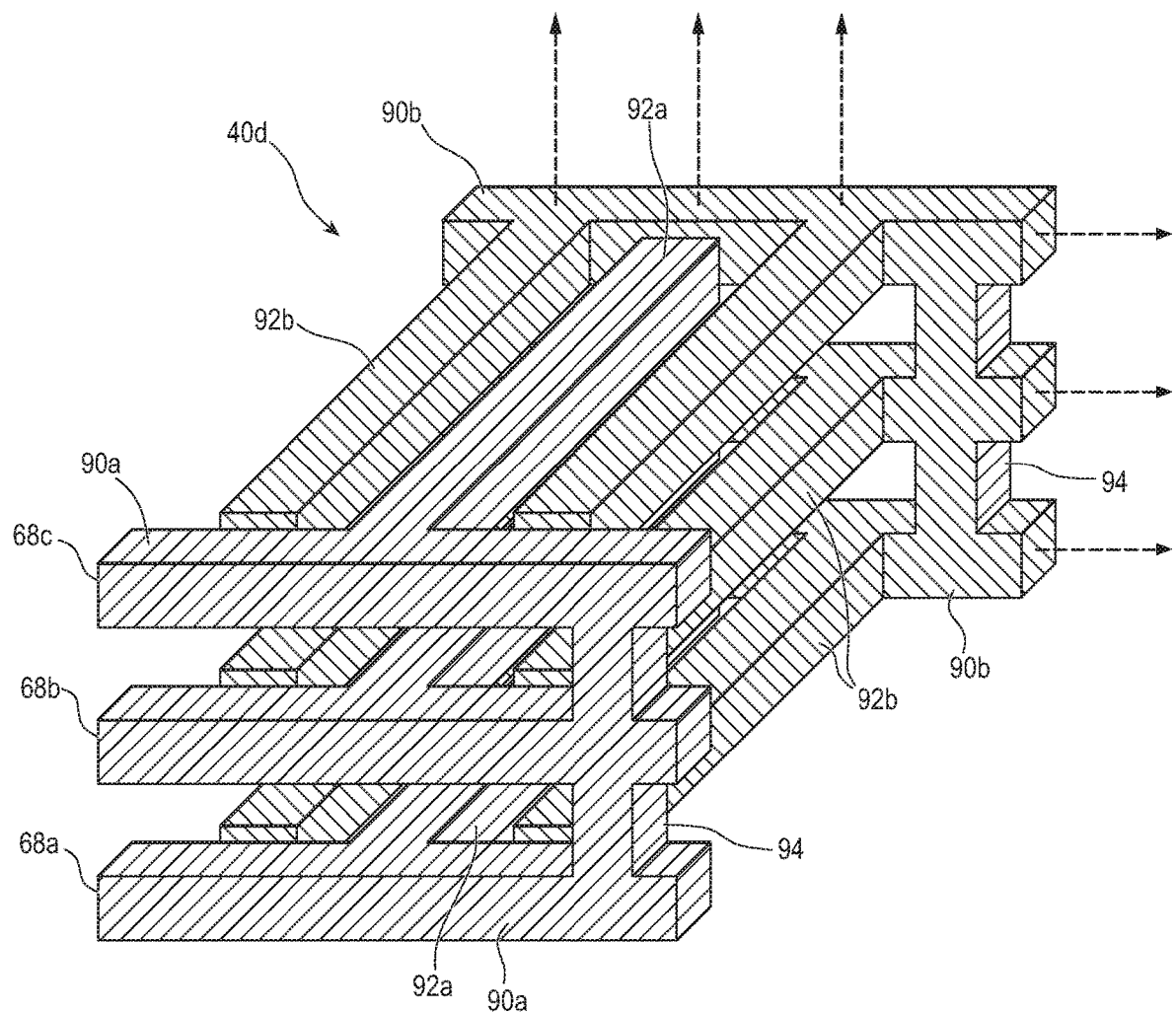

FIG. 5c illustrates MOM capacitor 40d, without vertical interleaving. In MOM capacitor 40d, each finger 92 is stacked vertically over fingers of the same polarity, i.e., all fingers 92a are vertically aligned over or under other fingers 92a, and fingers 92b are vertically aligned with other fingers 92b. MOM capacitor 40d without vertical interleaving of fingers 92 is suitable for higher voltages, up to 60-90 volts, which is typically the upper limits of ROSA high voltage inputs.

Fingers 92 are typically made 0.1 μm wide. For 60 volts, the typical horizontal spacing between fingers 92 is 0.3 μm but may be decreased for lower voltages and increased for higher voltages. The vertical space between adjacent conductive layers 68 is typically 0.17 μm. The target capacitance for capacitor 40 is conventionally 200 picofarads (pF). However, 180 pF is considered to be a safe design choice, and values as low as 100 pF provide adequate protection. A manufacturer can standardize on one finger spacing, e.g., 0.3 μm, so that qualification can be done just once for a given process technology. Thereafter, a specific chip is designed with an increased or reduced footprint or height of capacitor 40 to customize the capacitor for a given input voltage or desired capacitance value.

Figure 5D:
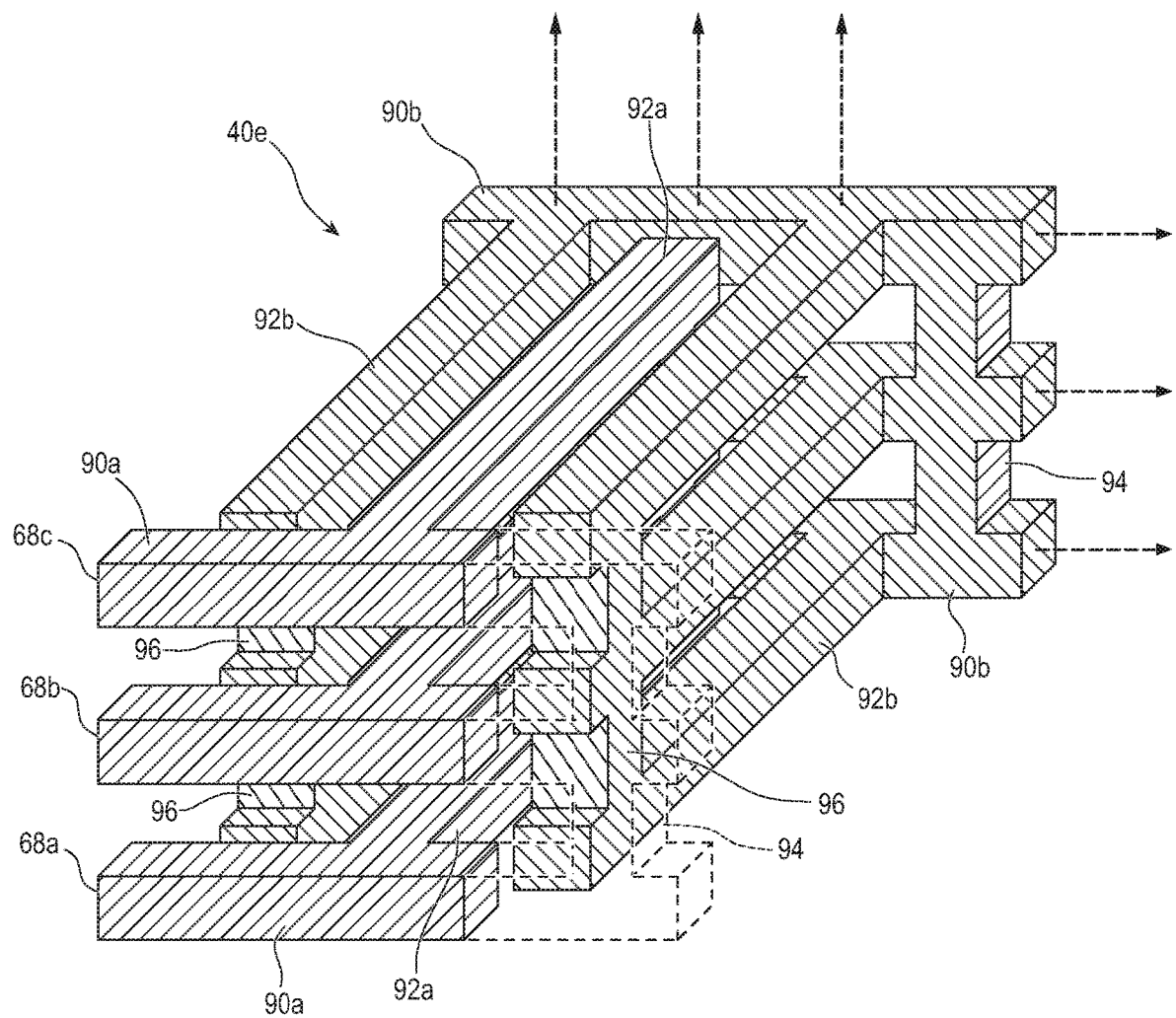

Conductive vias 94 connect each layer of MOM capacitors 40c and 40d to each other via the layers' respective bus bars 90. With fingers 92 of the same polarity being vertically aligned as in FIG. 5c, additional conductive vias can be formed directly connecting fingers 92 to each other. FIG. 5d illustrates MOM capacitor 40e with conductive vias 96 formed between vertically aligned fingers 92. Conductive vias 96 generate additional capacitance for capacitor 40e by building a conductive wall in the vertical plane, effectively adding extra vertically oriented fingers 92 to the MOM stack.

Figure 5E:
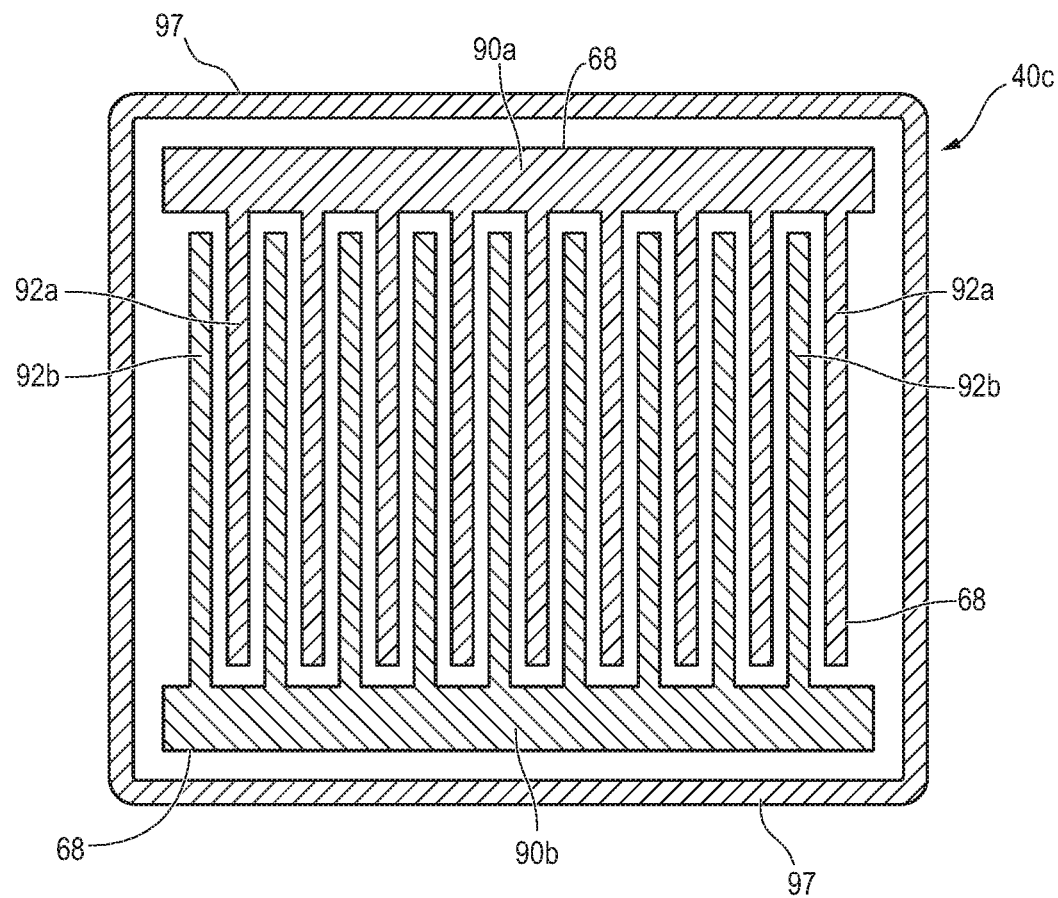

FIG. 5e illustrates an optional guard ring 97 formed around MOM capacitor 40c. A separate guard ring 97 is formed as part of each conductive layer 68 around the plates of capacitor 40c in that respective conductive layer to reduce the effects induced by the high voltage into surrounding circuitry. Conductive vias 94 can be formed to connect each guard ring 97 of each conductive layer 86. Typically, a gap of about 10 μm is provided between MOM capacitor 40c and other surrounding circuitry, and conductive ring 97 is formed in the gap. In other embodiments, the 10 μm gap can be larger or smaller depending on design constraints and desires. Guard rings 97 can be formed as part of conductive layers 68 around any of the above or below described MOM or MIM capacitor embodiments.

Figure 5F:
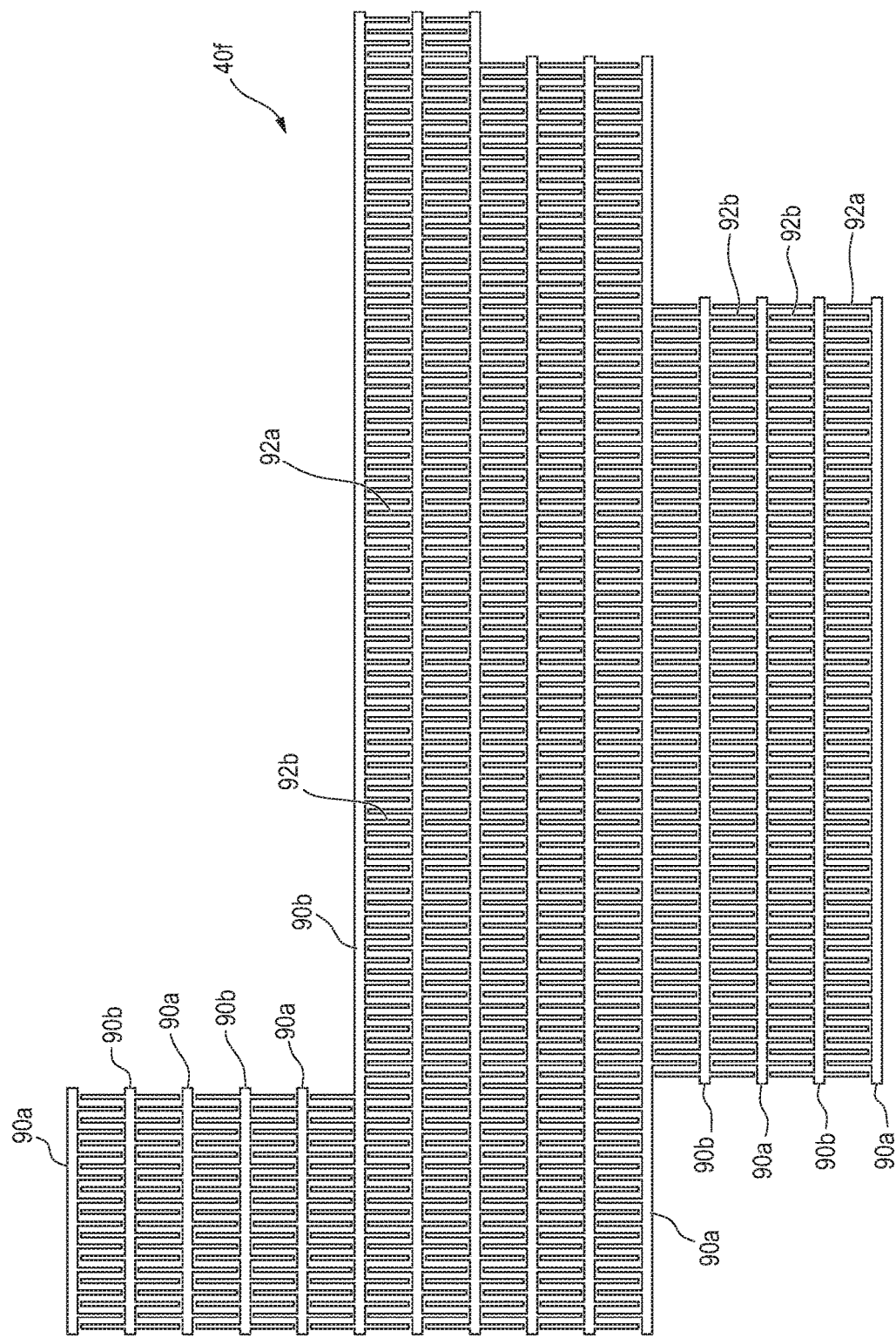

Besides having a square-shaped footprint as illustrated above, MOM capacitors can be formed in any arbitrary footprint. FIG. 5f illustrates MOM capacitor 40f with an exemplary footprint. The shape is accommodated by using multiple bus bars 90 in parallel. Each bus bar 90 can have a different length depending on the length of the footprint of MOM capacitor 40f at the particular location. Bus bars alternate vertically between bus bars 90a and 90b. The number of bus bars 90 is customized to the desired width of capacitor 40f. Each bus bar 90a includes fingers 92a extending toward each adjacent bus bar 90b. For internally located bus bars 90a, fingers 92a extend in two different directions perpendicular to the length of the bus bar because there are two adjacent bus bars 92b. Similarly, bus bars 90b can have fingers 92b extending in two different directions from the bus bar. For bus bars 90 on the edge of the MOM capacitor 40f footprint, fingers 92 only extend in toward the middle of the capacitor.

Figure 6A:
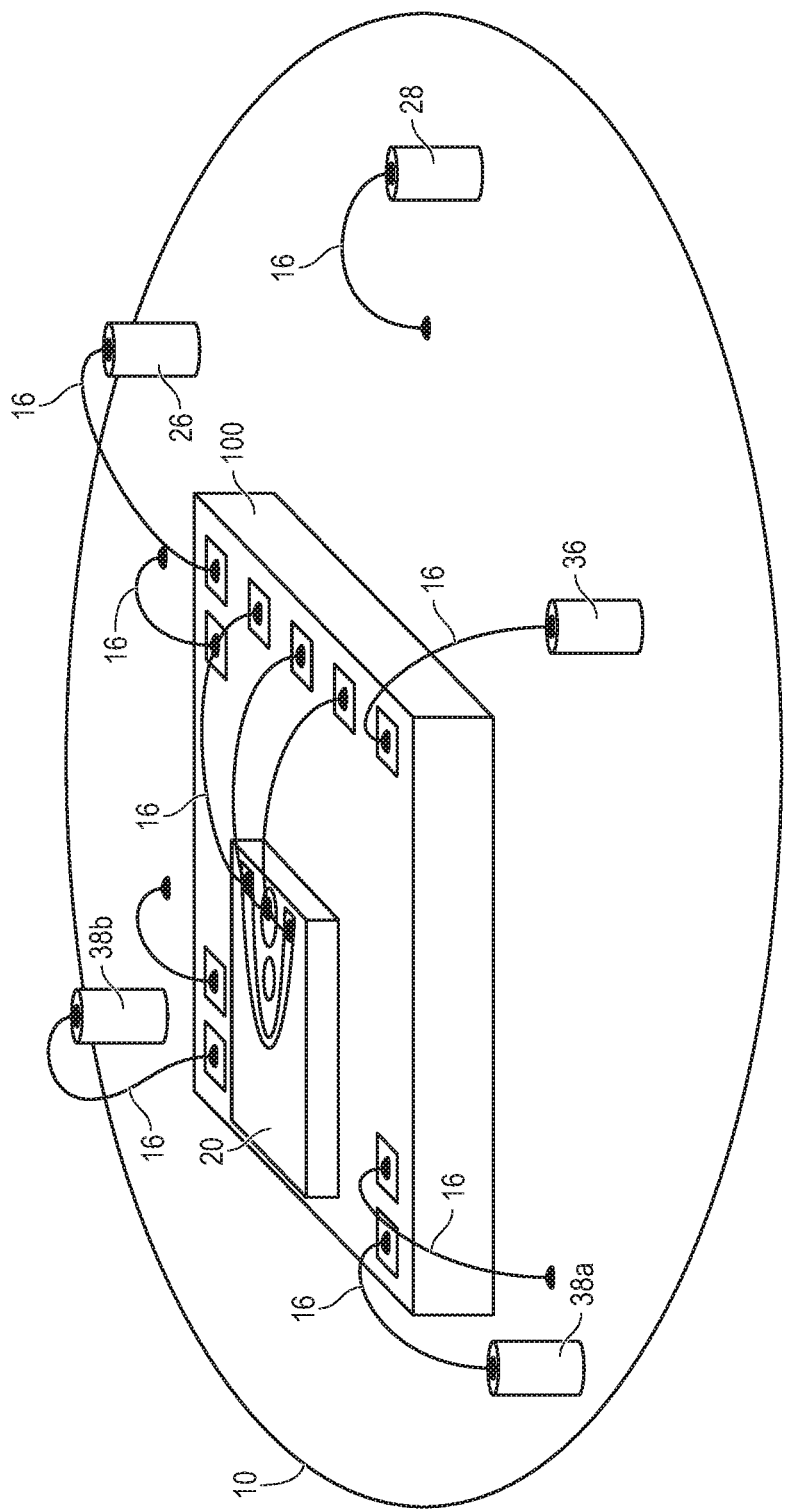
FIGS. 6a and 6b illustrate the transimpedance amplifier with integrated high voltage capacitor in a stacked configuration with an avalanche photodiode.
Figure 6B:
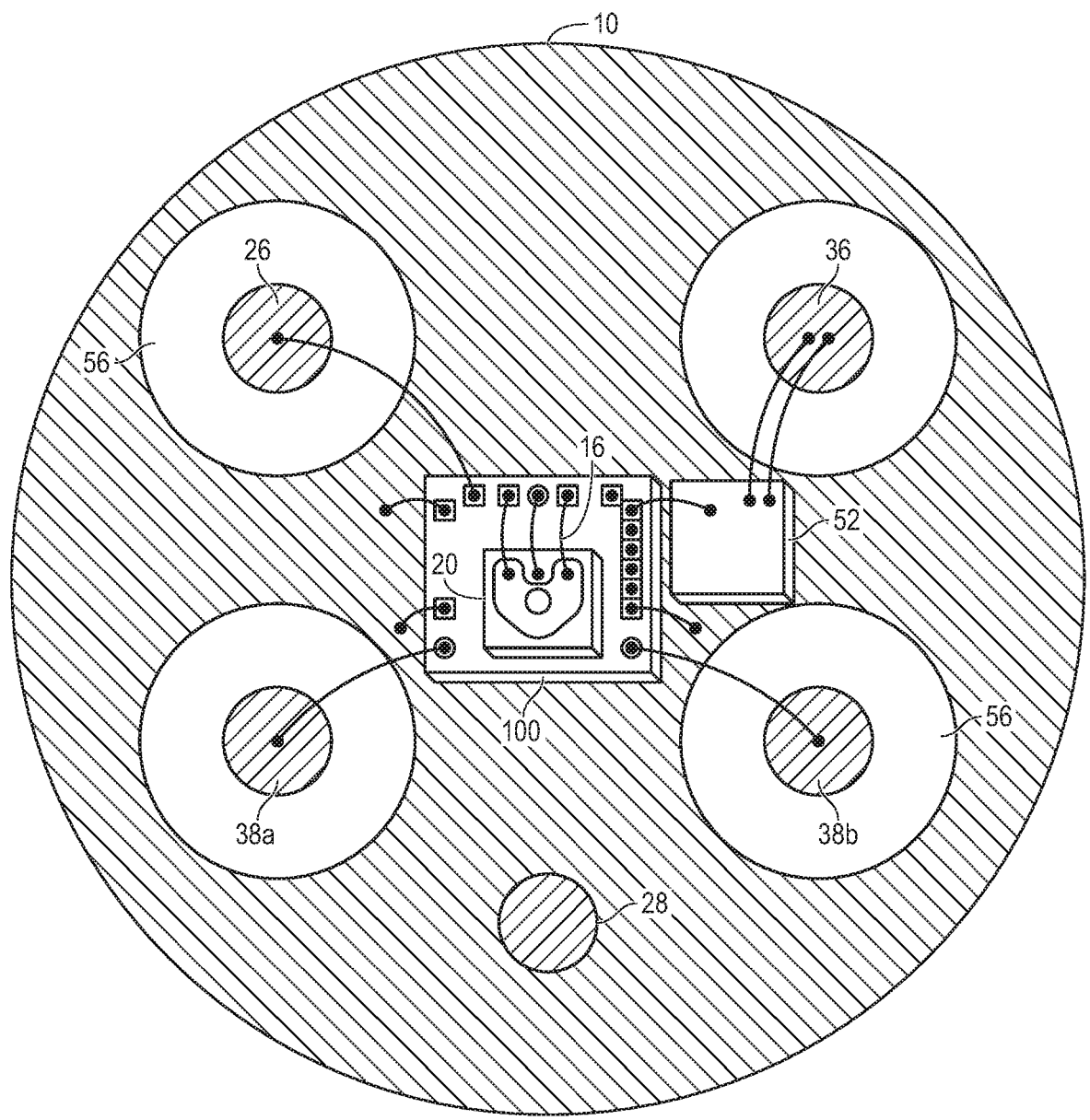

FIGS. 6a and 6b illustrate a ROSA device including an APD 20 stacked on a TIA package 100. FIG. 6a illustrates a perspective view, and FIG. 6b illustrates a top-down view. Five legs of the can package extend through the bottom of the can as ground node 28, high voltage input 26, low voltage input 36, and output signal 38. In the illustrated embodiment, output 38 is a balanced output with two signals 38a and 38b.

TIA package 100 includes a high voltage capacitor 40, formed as a MOM capacitor, MIM capacitor, or another integrated passive device (IPD) technology. The high voltage input 26 is coupled to TIA package 100 by a bond wire 16, either directly or through a discrete resistor 42. Conductive layers of TIA package 100 route the high voltage source to one side of the integrated high voltage capacitor 40, and another bond wire 16 connects the high voltage signal to APD die 20. High voltage capacitor 40 has a second side coupled to ground to filter 5 GHz interference via another bond wire 16 and conductive layers 68.

In some embodiments, resistor 42 is formed as an IPD on TIA package 100 along with capacitor 40. Resistor 42 may be formed from polysilicon deposited over the semiconductor die or within the build-up interconnect structure comprised of insulating layers 66 and conductive layers 68. The poly resistor 42 connects the high voltage pad of TIA package 100 to the high voltage plate of capacitor 40. Precautions may need to be taken to ensure that resistor 42 is capable of withstanding electro-static discharge (ESD) events. Guard rings and ground planes can be formed around or under resistor 42 to reduce the impact of ESD events on the semiconductor die. Sufficient spacing between high voltage components, e.g., resistor 42 and capacitor 40, and the lower voltage circuit components improves the ability to limit damage during an ESD event. In one embodiment, resistor 42 is a 500 Ohm resistor. In other embodiments, resistor 42 has a value anywhere from 0 to 5,000 Ohms. Larger resistors can be used if suitable for a given situation.

APD die 20 is stacked on TIA package 100 in FIGS. 6a and 6b, which reduces the overall system footprint. Total interconnect length, and therefore inductance, is reduced by eliminating superfluous components that would otherwise have to be connected by bond wires 16. Interconnect length is further reduced by orienting contact pads of APD 20 near contact pads of TIA 100 to reduce the length of bond wires 16. FIG. 6b illustrates an optional passive component 52 used to filter the low voltage power signal 36. The high voltage passive components in package 44 are still eliminated due to integration on TIA package 100. In some embodiments, the low voltage passive components 52 are integrated on TIA package 100 as well.

Figure 7:
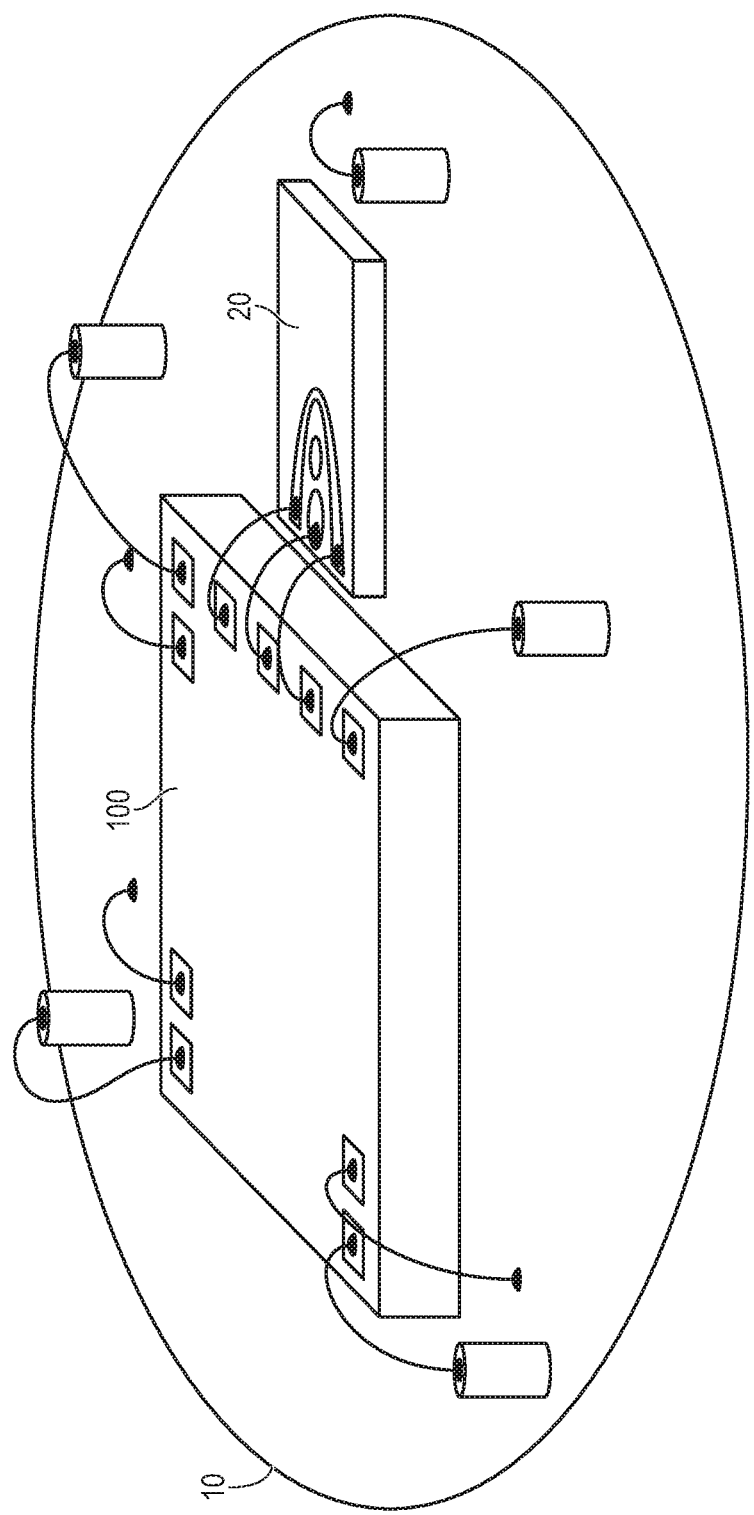
FIG. 7 illustrates the transimpedance amplifier with integrated high voltage capacitor in a side-by-side configuration with the avalanche photodiode.

FIG. 7 illustrates a configuration with APD die 20 disposed on the bottom of can 10 adjacent to TIA package 100. Again, a high voltage capacitor is integrated onto TIA package 100 to reduce the number of components required, and the overall size of components. APD die 20 is disposed with contact pads oriented toward TIA package 100 to reduce interconnect length.

Figure 8A:
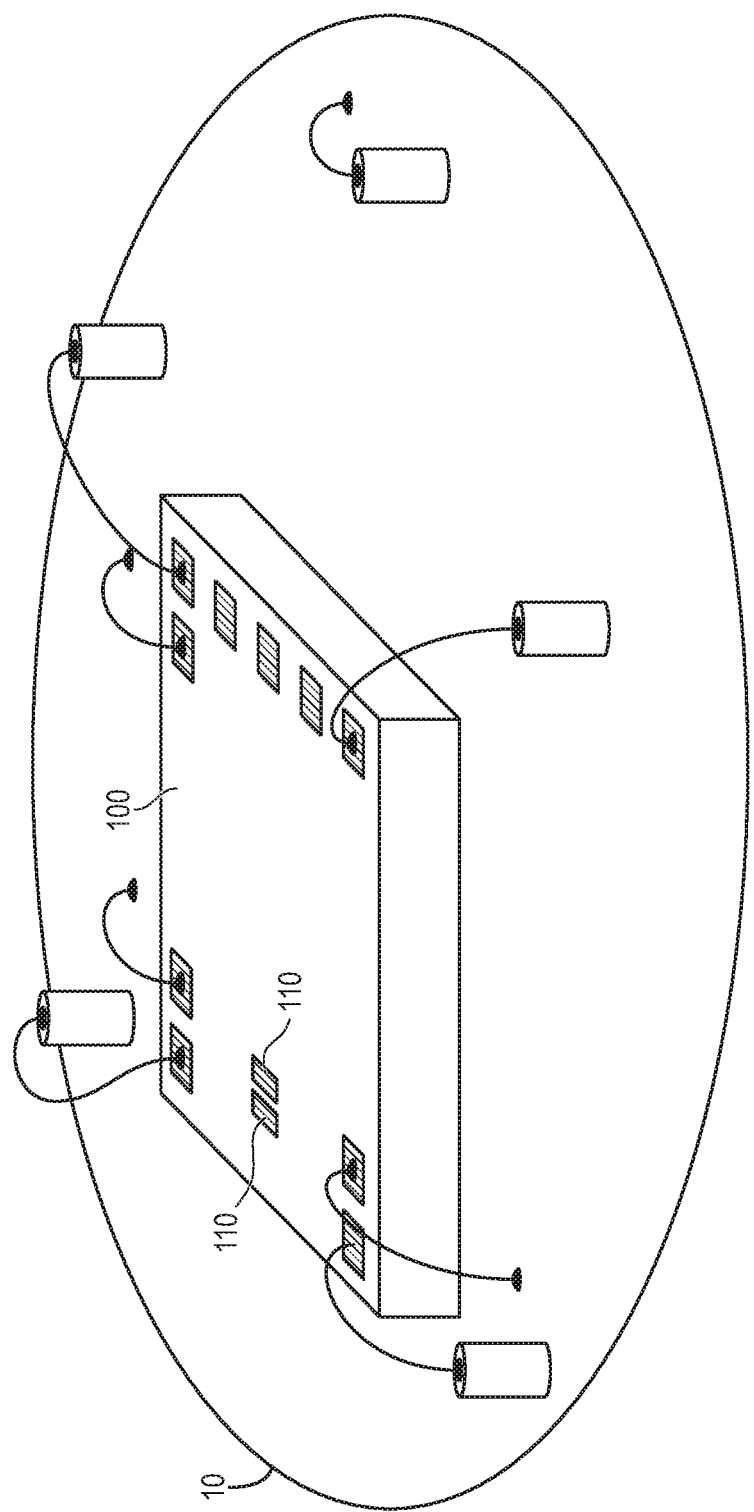
FIGS. 8a-8c illustrate a stacked configuration with the APD connected to the high voltage input through a contact pad on the bottom of the APD.
Figure 8B:
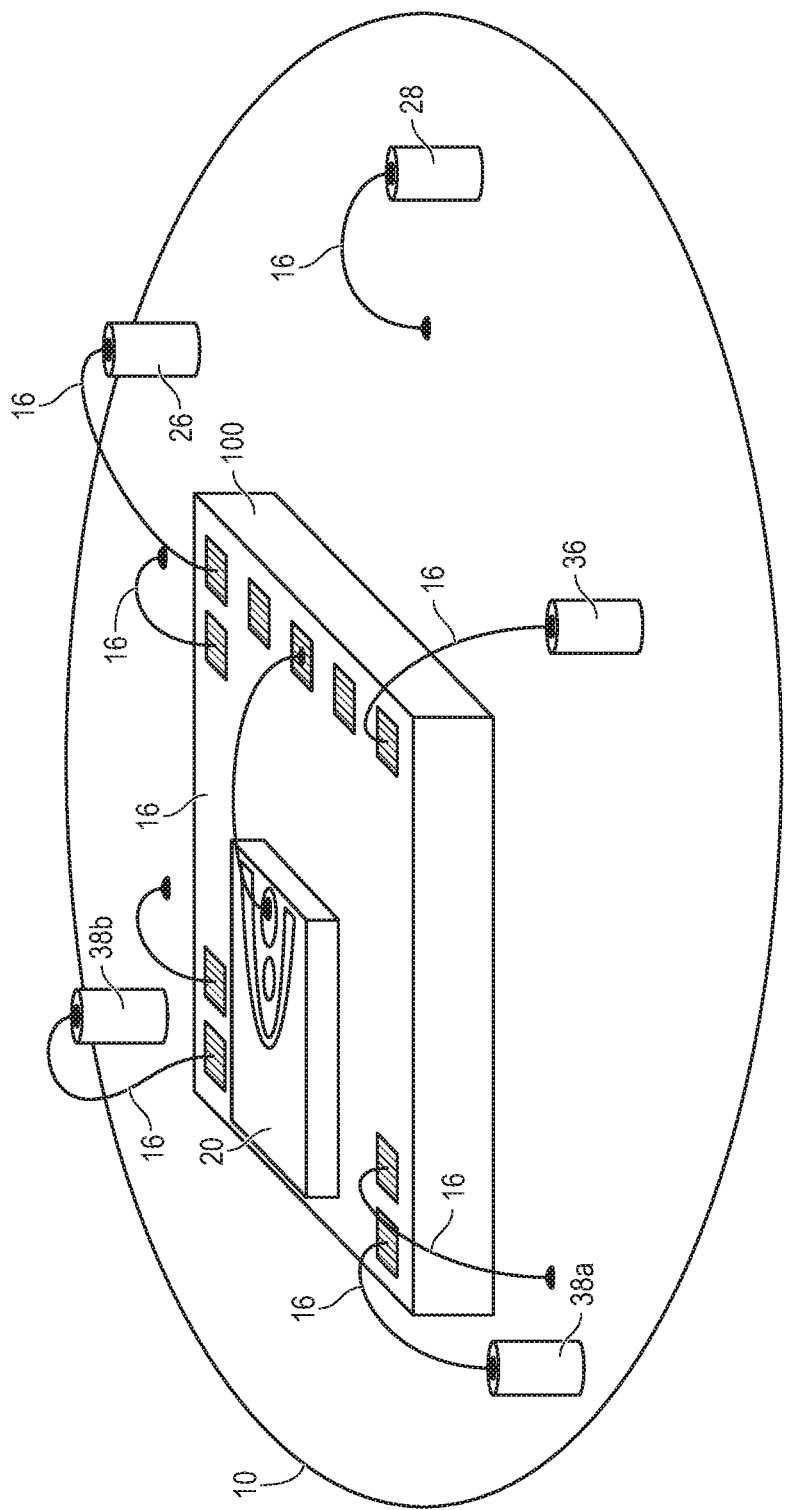
Figure 8C:
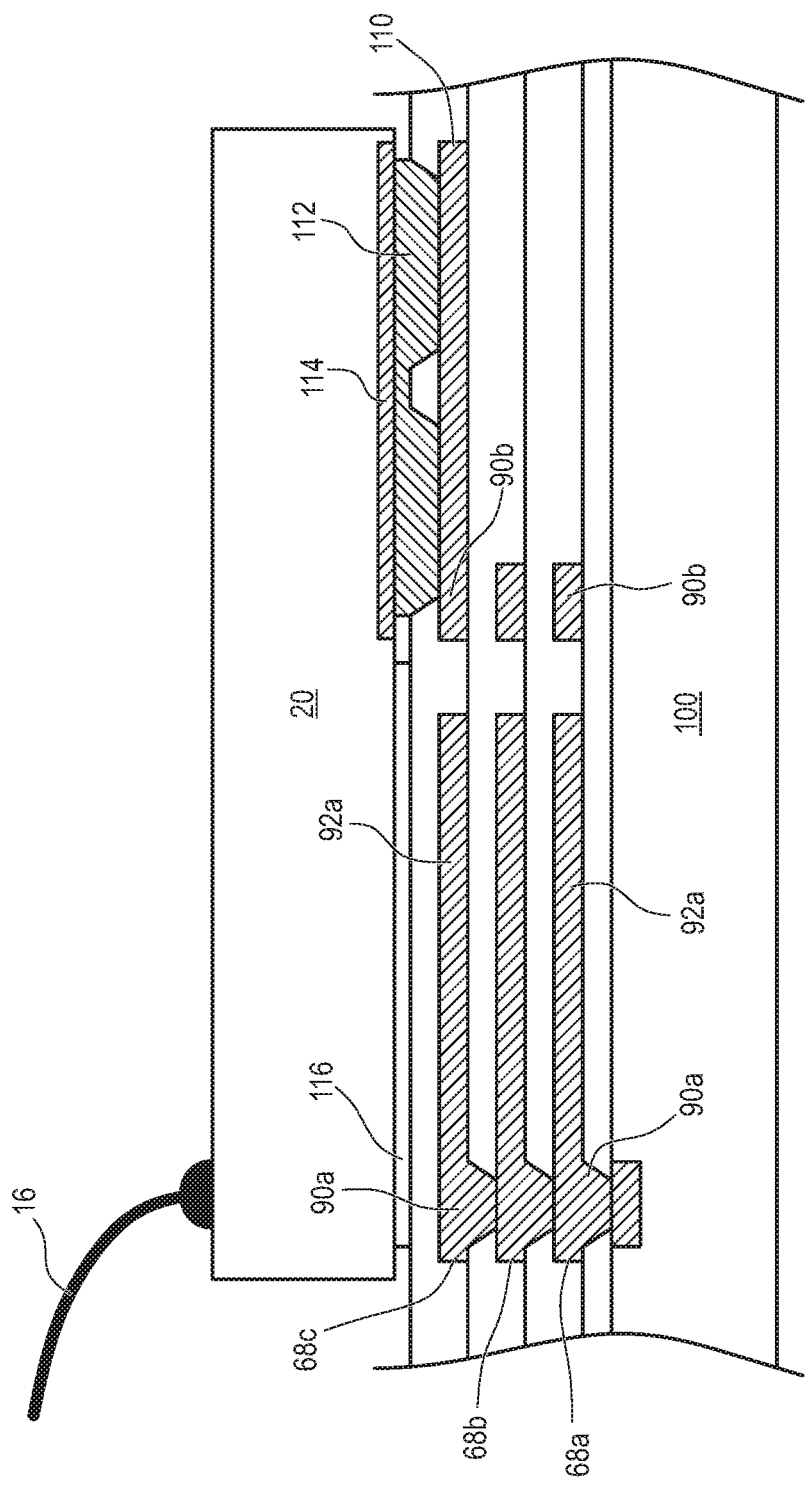

FIGS. 8a-8c illustrate an embodiment with the high voltage node coupled from TIA 100 to APD 20 through a contact pad on the bottom of the APD. In FIG. 8a, a pair of openings is formed through the top insulating layer 66 to expose a contact pad 110 of the top conductive layer 68. The top insulating layer 66 forms an oxide bridge between the two exposed portions of contact pad 110. The openings over contact pad 110 are preferably rectangular shaped and form a square in combination. However, any other suitable shape is used in other embodiments. Having the opening over contact pad 110 split into two sections reduces physical stress on the semiconductor die of APD 20, relative to one large hole, which could reduce performance. Two smaller holes, rather than one large hole, also provides improved support to the APD due to the viscosity of conductive epoxy which is typically used.

Contact pad 110 is coupled directly to the high voltage side of capacitor 40 formed on TIA 100, and coupled to high voltage input 26 through resistor 42. Contact pad 110 allows an APD to be directly connected to the high voltage input using surface-mount or flip-chip technology rather than a bond wire. Contact pad 110 can be a direct extension from a bus bar 90 or upper plate 72, or capacitor 40 can be located remotely from capacitor 40 and connected by a conductive trace of a conductive layer 68.

FIG. 8b illustrates APD 20 disposed on TIA package 100 over high voltage contact pad 110. The cathode of APD 20 is connected to the high voltage input through a contact pad on the bottom of the APD, and the anode of APD 20 is connected by a bond wire 16 to an input pad of TIA 100. A plurality of bond wires in parallel is used to connect the anode of APD 20 to TIA 100 in other embodiments. FIG. 8c shows a cross-section of TIA 100 with bus bars 90a and 90b and fingers 92a. Fingers 92b are interleaved horizontally with fingers 92a and appear in other cross-sections. The top bus bar 90b includes pad 110 extending from the bus bar.

In one embodiment, pad 110 is formed directly above capacitor 40 in an overlying conductive layer 68, rather than, off to the side in the same conductive layer. A grounded RF shield can be formed in one of the conductive layers 68 between capacitor 40 and APD 20 to reduce interference. Conductive epoxy 112, solder paste, solder bump, or other suitable interconnect structure is used to electrically couple contact pad 114 of the APD to contact pad 110. An optional adhesive 116 is used between APD 20 and TIA 100 for physical support. In some embodiments, the body of APD 20 is either at the voltage potential of the cathode, or left floating to reduce leakage through the body of the APD.

Integrating high voltage capacitor 40 on TIA package 100 reduces cost by eliminating a part from the ROSA package bill-of-materials, simplifies manufacturing by requiring fewer parts and fewer bond wires, improves immunity from Wi-Fi interference relative to using a discrete capacitor due to the removed bond wire, and improves optics by allowing more flexibility in placement of APD 20. Integrating a high voltage capacitor 40 works with any TIA device and any APD/TIA circuit topology.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making an avalanche photodiode (APD)-based optical receiver with an integrated high-voltage radio frequency (RF) filter, comprising:
   providing a semiconductor die including a transimpedance amplifier;
   forming an integrated capacitor on the semiconductor die directly over and within a footprint of the transimpedance amplifier, wherein the integrated capacitor includes,
      a first bus bar, wherein the first bus bar is electrically isolated from all components formed in the semiconductor die,
      a first plurality of fingers extending from the first bus bar,
      a second bus bar,
      a second plurality of fingers extending from the second bus bar, wherein the second plurality of fingers is interleaved with the first plurality of fingers within a first conductive layer with a horizontal spacing of approximately 0.3 micrometers ($\mu$m) between individual fingers of the first plurality of fingers and second plurality of fingers,
      a third bus bar formed over the first bus bar,
      a third plurality of fingers extending from the third bus bar, wherein each finger of the third plurality of fingers is aligned directly over a respective finger of the first plurality of fingers,
      a fourth bus bar formed over the second bus bar,
      a fourth plurality of fingers extending from the fourth bus bar, wherein each finger of the fourth plurality of fingers is aligned directly over a respective finger of the second plurality of fingers,
      a first conductive via extending from the first bus bar to the third bus bar, and
      a second conductive via extending from the second bus bar to the fourth bus bar;
   forming an integrated resistor over the semiconductor die, wherein the integrated resistor and integrated capacitor form a radio frequency (RF) filter;
   disposing the semiconductor die into a can-shaped package;
   disposing an avalanche photodiode (APD) on the semiconductor die with a cathode of the APD coupled to a circuit node between the integrated capacitor and the integrated resistor;
   disposing a lens in an opening of the can-shaped package, wherein the can-shaped package is adapted to guide a fiber-optic signal through the lens and onto the APD; and
   coupling the circuit node to a high voltage input of the semiconductor device, wherein the high voltage input is configured to accept a voltage of between 60 and 90 volts.

2. The method of claim 1, further including patterning the first conductive layer to include a guard ring around the first bus bar, second bus bar, first plurality of fingers, and second plurality of fingers.

3. The method of claim 1, further including:
   providing a contact pad coupled to the integrated capacitor;
   forming an insulating layer over the contact pad;
   forming an opening in the insulating layer over the contact pad; and
   disposing the avalanche photodiode over the opening with a conductive material between the contact pad and photodiode.

4. The method of claim 3, further including forming a bond wire from the avalanche photodiode to the semiconductor die.

5. A method of making an optical receiver, comprising:
   providing a semiconductor die including a transimpedance amplifier;
   forming an integrated capacitor over the semiconductor die, wherein the integrated capacitor includes a plurality of interdigitated fingers with a finger spacing of 0.3 $\mu$m or greater between individual fingers of the plurality of interdigitated fingers;
   forming an integrated resistor over the semiconductor die, wherein the integrated resistor and integrated capacitor form a radio frequency (RF) filter;
   disposing the semiconductor die into a can-shaped package;
   disposing an avalanche photodiode (APD) over the semiconductor die with a cathode of the APD coupled to a circuit node between the integrated capacitor and the integrated resistor and an anode of the APD coupled to the transimpedance amplifier;
   disposing a lens in an opening of the can-shaped package, wherein the can-shaped package is adapted to guide a fiber-optic signal through the lens and onto the APD; and
   coupling the circuit node to a high voltage node, wherein the high voltage node is configured to operate at a voltage of 35 volts or more.

6. The method of claim 5, further including depositing a conductive epoxy between the avalanche photodiode and the semiconductor die.

7. The method of claim 5, wherein the plurality of interdigitated fingers are vertically aligned with each other by common polarity.

8. The method of claim 7, further including a plurality of conductive vias disposed between the plurality of interdigitated fingers.

9. The method of claim 5, further including forming a guard ring around the integrated capacitor.

10. The method of claim 5, wherein the integrated capacitor includes a first terminal that is electrically isolated from all components formed in the semiconductor die.

11. A method of making a semiconductor device, comprising:
    providing a semiconductor die comprising a transimpedance amplifier;
    forming a high voltage integrated capacitor on the semiconductor die, wherein the high voltage integrated capacitor includes a plurality of interdigitated fingers with a finger spacing of 0.3 $\mu$m or greater between individual fingers of the plurality of interdigitated fingers;
    forming an integrated resistor over the semiconductor die, wherein the integrated resistor and the high voltage integrated capacitor form a radio frequency (RF) filter; and
    disposing an avalanche photodiode (APD) over the semiconductor die with a cathode of the APD coupled to a circuit node between the high voltage integrated capacitor and the integrated resistor and an anode of the APD coupled to the transimpedance amplifier.

12. The method of claim 11, further including forming the high voltage integrated capacitor by forming a first conductive layer comprising a first portion of the plurality of interdigitated fingers.

13. The method of claim 12, further including forming the high voltage integrated capacitor by forming a second conductive layer comprising a second portion of the plurality of interdigitated fingers over the first conductive layer.

14. The method of claim 13, further including forming the high voltage integrated capacitor by forming a conductive via between a first finger of the first portion of the plurality of interdigitated fingers and a second finger of the second portion of the plurality of interdigitated fingers.

15. The method of claim 11, further including coupling the high voltage integrated capacitor to receive a high voltage signal through the integrated resistor, wherein the high voltage signal is between 60 and 90 volts.

16. The method of claim 11, further including depositing a conductive epoxy or solder between the semiconductor die and avalanche photodiode.

17. The method of claim 11, wherein the integrated capacitor includes a first terminal that is electrically isolated from all components formed in the semiconductor die.

* * * * *